(12) United States Patent
Yang et al.

(10) Patent No.: US 10,797,671 B1
(45) Date of Patent: Oct. 6, 2020

(54) ELECTRONIC DEVICE AND EQUALIZER ADJUSTMENT METHOD

(71) Applicant: Unlimiter MFA Co., Ltd., Eden Island (SC)

(72) Inventors: Kuo-Ping Yang, Taipei (TW); Neo Bob Chih-Yung Young, Taipei (TW); Kuan-Li Chao, Taipei (TW); Jian-Ying Li, Taipei (TW); I-Ting Lee, Taipei (TW); Wei-Ren Lan, Taipei (TW); Chih-Long Chang, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 16/705,337

(22) Filed: Dec. 6, 2019

(30) Foreign Application Priority Data

May 23, 2019 (TW) .................................. 108117929

(51) Int. Cl.
*H03G 5/16* (2006.01)
*H04R 3/04* (2006.01)
*G06F 3/16* (2006.01)
*H03G 5/00* (2006.01)

(52) U.S. Cl.
CPC ............. *H03G 5/165* (2013.01); *G06F 3/165* (2013.01); *H03G 5/005* (2013.01); *H04R 3/04* (2013.01)

(58) Field of Classification Search
CPC combination set(s) only.
See application file for complete search history.

(56) References Cited

U.S. PATENT DOCUMENTS

| | | | |
|---|---|---|---|
| 2005/0223878 A1* | 10/2005 | Furuta | G10H 1/00 84/609 |
| 2013/0013308 A1* | 1/2013 | Cao | G06Q 30/0271 704/237 |
| 2014/0016795 A1* | 1/2014 | Melamed | H04R 1/1041 381/74 |
| 2017/0099380 A1* | 4/2017 | Lee | H03G 5/025 |
| 2017/0126193 A1* | 5/2017 | Young | H03G 5/025 |
| 2017/0170796 A1* | 6/2017 | Young | H03G 5/165 |
| 2020/0037072 A1* | 1/2020 | Onoda | H04R 3/04 |

\* cited by examiner

*Primary Examiner* — Thang V Tran
(74) *Attorney, Agent, or Firm* — Bacon & Thomas, PLLC

(57) ABSTRACT

An electronic device and an equalizer adjustment method thereof are disclosed. The method comprises the steps of: storing a list of age gain values, the list of age gain values comprising a plurality of age segments, respectively increasing from the first age segment to the Nth age segment, each of the age segments comprising a group correcting parameters, the group correcting parameters including a plurality of compensation gain values respectively corresponding to a plurality of target frequency, and the compensation gain values in the same target frequency are increased as N increases; obtaining an age data of an user; obtaining the target age segment, wherein the target age segment is one of the age segments; obtaining the group correction parameter corresponding to the target age segment; and adjusting a gain value setting of the equalizer to sound at different frequencies according to the group correction parameter.

13 Claims, 2 Drawing Sheets

ELECTRONIC DEVICE AND EQUALIZER ADJUSTMENT METHOD

BACKGROUND OF THE INVENTION

1. Field of the Invention

The present invention relates to an electronic device and an equalizer adjustment method thereof, particularly to an electronic device and an equalizer adjustment method thereof that can be used to adjust an equalizer according to age data.

2. Description of the Related Art

Equalizer (EQ) is a tool for adjusting sound, which can adjust gain values of the sound in each frequency band. That is, the gain value of the sound (or an audio file) can be adjusted at different frequencies, and thus the auditory effect produced by the output sound is changed. For example, the blasting sound presented by the heavy bass is more shocking and realistic. Therefore, the current equalizer is mainly used for the adjustment of output sound effects. Most of the existing computers also have an equalizer application for users to enjoy while listening to music.

As to adjusting the gain value setting of an equalizer, a user usually individually adjusts the gain value of a frequency. Alternatively, multiple modes are built in for the user to directly select different modes to adjust the gain values of multiple frequencies at one time as entertainment when listening to music. However, for users of different ages, the degree of hearing is different for different frequencies, and there is still no mode to adjust the gain value according to the age of the user, which is necessary for improvement.

Accordingly, it is necessary to devise a new electronic device and an equalizer adjustment method thereof to solve the deficiency in the prior art.

SUMMARY OF THE INVENTION

It is a major objective of the present invention to provide an equalizer adjustment method that can be used to adjust an equalizer according to age data.

It is another major objective of the present invention to provide an electronic device used for the method described above.

To achieve the above objectives, an electronic device of the present invention includes an equalizer, a storage module, and an equalizer adjustment module. The storage module stores a list of age gain values. The list of age gain values comprises a plurality of age segments respectively increasing from the first age segment to the Nth age segment. Each of the age segments comprises a group correction parameter. The group correction parameter includes a plurality of compensation gain values respectively corresponding to a plurality of target frequency. The compensation gain values in the same target frequency are increased as N increases. The equalizer adjustment module is electrically connected to a storage module and an equalizer. The equalizer adjustment module includes an age data acquisition unit, a parameter inquiry unit, and a parameter setting unit. The age data acquisition unit is used to obtain an age data of the user. The parameter inquiry unit obtains a target age segment according to the age data, wherein the target age segment is one of the age segment. The parameter inquiry unit obtains the group correction parameter corresponding to the target age segment. The parameter setting unit adjusts a gain value setting of the equalizer to sound at different frequencies according to the group correction parameter.

The equalizer adjustment method of the present invention comprises the steps of: storing a list of age gain values, the list of age gain values comprising a plurality of age segments, respectively increasing from the first age segment to the Nth age segment, each of the age segments comprising a group correcting parameters, the group correcting parameters including a plurality of compensation gain values respectively corresponding to a plurality of target frequency, and the compensation gain values in the same target frequency are increased as N increases; obtaining an age data of an user; obtaining the target age segment, wherein the target age segment is one of the age segments; obtaining the group correction parameter corresponding to the target age segment; and adjusting a gain value setting of the equalizer to sound at different frequencies according to the group correction parameter.

DETAILED DESCRIPTION OF THE PREFERRED EMBODIMENT

Hereafter, the technical content of the present invention will be better understood with reference to preferred embodiments.

Figure 1:
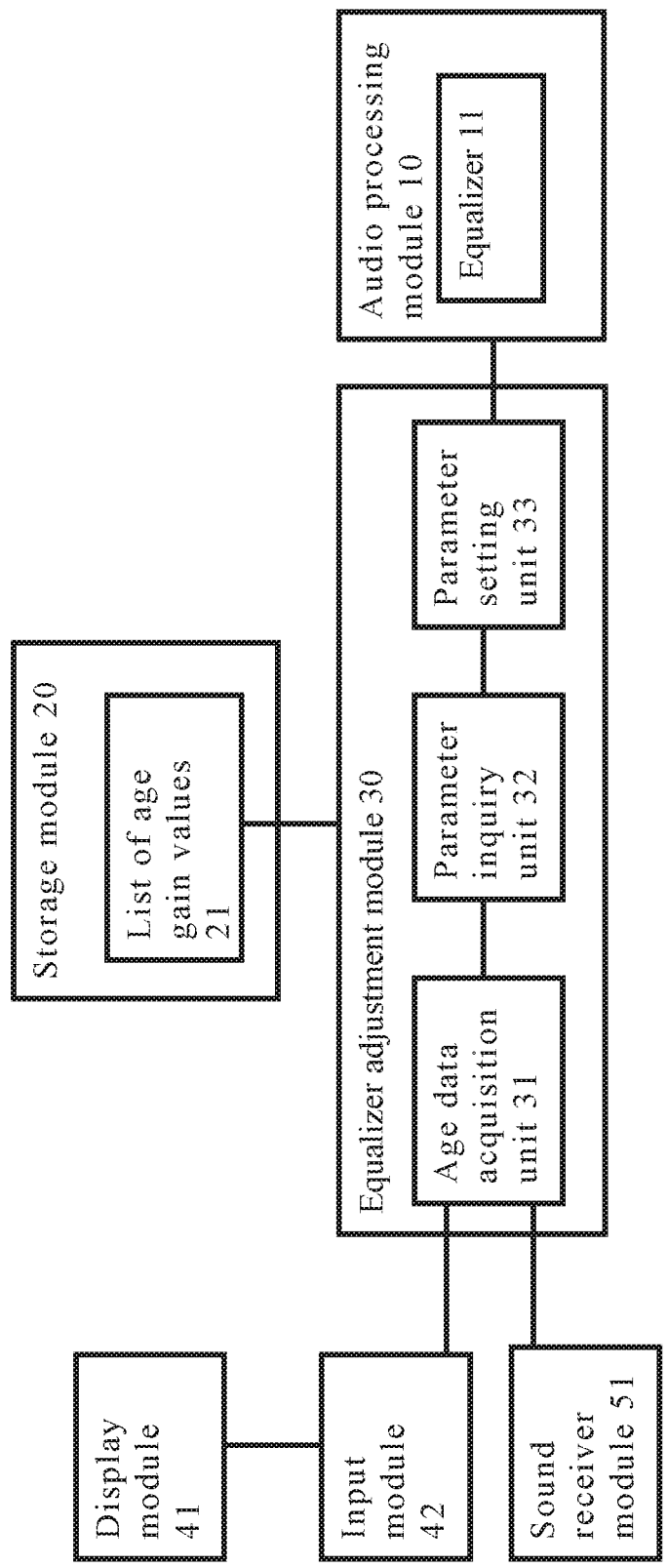
FIG. 1 is an architecture diagram of an electronic device in the present invention.

Hereafter please refer to FIG. 1 for an architecture diagram of an electronic device in the present invention.

In the present embodiment of the present invention, an electronic device 1 can be, for example but not limited to, a notebook computer, a tablet computer, a smart phone, or other electronic device with arithmetic processing functions. For example, a speaker having a central processing unit (CPU) or other processor can also be used as the electronic device 1 of the present embodiment. The electronic device 1 comprises an equalizer 11, a storage module 20, and an equalizer adjustment module 30. The equalizer 11 is provided in the audio processing module 10. Specifically, the audio processing module 10 can store the software or firmware of the equalizer 11, or a combination thereof. Therefore, the equalizer 11 is provided in the audio processing module 10. Through adjusting the gain value setting of the equalizer 11, the gain value of output sound at different frequencies by the audio processing module 10 can be adjusted. For example, if the gain value of 500 Hz (specified frequency) is increased to 5 dB, the output sound at a volume of 500 Hz can be increased by 5 dB. Since the equalizer 11 is a common sound output adjustment tool, its structure and principle are familiar to those with ordinary skill in the art, and thus will not be described here.

The storage module 20 can be a fixed or removable non-transitory computer readable storage medium, including but not limited to random access memory (RAM), read-only memory (ROM), Flash memory, optical disc, other similar component, or a combination of the above. The storage module 20 stores a list of age gain values 21. The list of age gain values 21 comprises a plurality of age segments between a first age segment and a Nth age segment, respectively increasing from the first age segment to the Nth age segment. Each of the age segments comprises a group correction parameter. The group correction parameter comprises a plurality of compensation gain values respectively corresponding to a plurality of target frequency. The compensation gain values in the same target frequency are increased as N increases, as shown in the table below.

| Age (years old)\Frequency (Hz) | 250 | 500 | 1K | 2K | 4K | 8K | 12.5K | 16K |
|---|---|---|---|---|---|---|---|---|
| 5~29 | 1.9 | 1.9 | 1.7 | 1.5 | 1.7 | 2.5 | 3.7 | 6.5 |
| 30~39 | 2.1 | 2.0 | 1.9 | 1.7 | 2.2 | 2.6 | 4.0 | 7.6 |
| 40~49 | 2.4 | 2.2 | 2.0 | 1.9 | 2.4 | 2.8 | 5.5 | 9.5 |
| 50~59 | 2.4 | 2.4 | 2.4 | 2.1 | 2.7 | 4.2 | 8.3 | 10.4 |
| 60~69 | 2.6 | 2.6 | 2.5 | 2.8 | 4.0 | 6.3 | 10.1 | 11.8 |
| 70~90 | 3.0 | 3.1 | 3.2 | 4.0 | 5.6 | 8.8 | 11.4 | 12.0 |

The list of age gain values 21 includes the age segments from 5 to 29 years old to the age segments from 70 to 90 years old. Each of the age segments has a corresponding compensation gain value with 250 Hz, 500 Hz, 1 kHz, 2 kHz, 4 kHz, 8 kHz, 12.5 kHz, and 16 kHz. Also, as can be seen from the list of age gain values 21, the compensation gain values are between 1.5 and 15. When the target frequency is between 250 Hz and 2 kHz, the compensation gain values corresponding to the target frequency are between 1.5 and 4. When the target frequency is greater than 4 kHz, the compensation gain values will increase to between 1.7 and 12. However, it should be noted that the compensation gain values of the aforementioned list of age gain values 21 are merely illustrative, and the present invention is not limited thereto.

The equalizer adjustment module 30 is electrically connected to the storage module 20 and the equalizer 11. The equalizer adjustment module 30 includes an age data acquisition unit 31, a parameter inquiry unit 32, and a parameter setting unit 33. The age data acquisition unit 31 is used to obtain an age data of a user. In an embodiment of the present invention, the electronic device 1 further includes a display module 41 and an input module 42. The display module 41 is used to display an image screen, which can be a general display screen or a touch-sensitive display screen. If the display module 41 is a touch-sensitive display screen, the display module 41 and the input module 42 may be an integral structure. In addition, the input module 42 can also be a mouse or a keyboard input device, but the present invention is not limited thereto. The display module 41 is electrically connected to the equalizer adjustment module 30. An age input interface is provided by the age data acquisition unit 31 to the display module 41. The input module 42 is electrically connected to the equalizer adjustment module 30. After the display module 41 displays the age input interface, the user can input the age by using the input module 42. Then, the age data acquisition unit 31 can receive the age data of the user from the input module 42. In another embodiment of the present invention, the electronic device 1 further includes a sound receiver module 51 that is electrically connected to the equalizer adjustment module 30. The sound receiver module 51 can be a microphone. The age data acquisition unit 31 receives a sound file containing a user voice signal indicating the age of the user from the sound receiver module 51. Accordingly, the age data acquisition unit 31 can obtain the age data according to the sound file.

The parameter inquiry unit 32 is used to obtain a target age segment according to the age data. The target age segment is one of the age segments listed in the list of age gain values 21. In this way, the parameter inquiry unit 32 obtains the group correction parameter corresponding to the target age segment. Finally, the parameter setting unit 33 is used to adjust a gain value setting of the equalizer 11 to sound at different frequencies according to the group correction parameter obtained by the parameter inquiry unit 32.

It should be noted that each module in the electronic device 1 may be configured as a hardware device, software program in combination with hardware device, or firmware in combination with hardware device. For example, a computer program product may be stored in a computer readable medium and read and executed to achieve the functions of the present invention, but the present invention is not limited in the manner described above. Additionally, the preferred embodiment of the present invention described here is only illustrative. To avoid redundancy, all the possible combinations of changes are not documented in detail. However, it shall be understood by those skilled in the art that each of the modules or elements described above may not be necessary. For the implementation of the present invention, the present invention may also contain other detailed, conventional modules or elements. Each module or component is likely to be omitted or modified depending on the needs. Other modules or elements may not necessarily exist between two of any modules.

Figure 2:
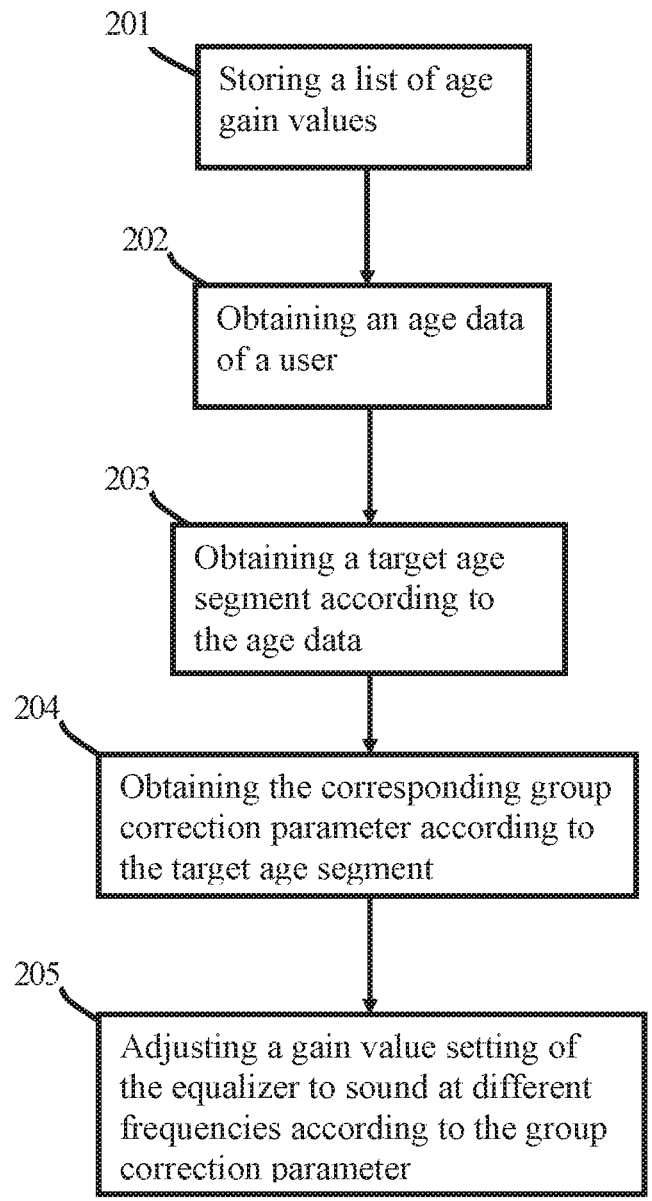
FIG. 2 is a flowchart showing steps of an equalizer adjustment method in the present invention.

Then, please refer to FIG. 2 for a flowchart showing steps of an equalizer adjustment method in the present invention. It should be noted that although the aforementioned electronic device 1 10 is used as an example for illustrating the method for adjusting output sound in the present invention, the method in the present invention is not limited to the use of the electronic device 1 with the same structure described above.

Firstly, in Step 201: Storing a list of age gain values.

First, a list of age gain values 21 is stored in the storage module 20. The list of age gain values 21 comprises a plurality of age segments between a first age segment and a Nth age segment, respectively increasing from the first age segment to the Nth age segment, each of the age segments comprising a group correction parameter, the group correction parameter comprising a plurality of compensation gain values, respectively corresponding to a plurality of target frequency, and the compensation gain values in the same target frequency are increased as N increases.

Then, in Step 202: Obtaining an age data of a user.

The age data acquisition unit 31 is used to obtain an age data of a user. The age data acquisition unit 31 can receive the age data of the user from the input module 42 or receive the age file of the user by using a sound receiver module 51, but the present invention is not limited thereto.

In Step 203: Obtaining a target age segment according to the age data.

The parameter inquiry unit 32 is used to obtain a target age segment according to the age data, wherein the target age segment is one of the age segments listed in the list of age gain values 21.

Then, in Step 204: Obtaining the corresponding group correction parameter according to the target age segment.

The parameter inquiry unit 32 obtains the corresponding group correction parameter according to the target age segment.

Finally, in Step 205: Adjusting a gain value setting of the equalizer to sound at different frequencies according to the group correction parameter.

The parameter setting unit 33 is used to adjust the gain value setting of the equalizer to sound at different frequencies according to the group correction parameter obtained by the parameter inquiry unit 32.

It should be noted that the equalizer adjustment method of the present invention is not limited to the order of the above steps, and the order of the above steps may be changed as long as the objective of the present invention can be achieved.

As above, according to the above embodiment, the electronic device 1 can know how to adjust the setting of the equalizer 11 according to the age of the user.

It should be noted that the embodiments of the present invention described above are only illustrative. All without departing from the scope of the invention are defined solely by the appended claims.

What is claimed is:

1. An equalizer adjustment method, applicable to an electronic device, the electronic device comprising an equalizer, a storage module, and an equalizer adjustment module, the equalizer adjustment method further comprising the following steps:
    storing a list of age gain values in the storage module, the list of age gain values comprising a plurality of age segments between a first age segment and a Nth age segment, respectively increasing from the first age segment to the Nth age segment, each of the age segments comprising a group correction parameter, the group correction parameter comprising a plurality of compensation gain values respectively corresponding to a plurality of target frequency, and the compensation gain values in the same target frequency are increased as N increases;
    obtaining an age data of an user;
    obtaining a target age segment according to the age data, wherein the target age segment is one of the age segments;
    obtaining the corresponding group correction parameter according to the target age segment; and
    adjusting a gain value setting of the equalizer to sound at different frequencies through the equalizer adjustment module according to the group correction parameter.

2. The equalizer adjustment method as claimed in claim 1, wherein the compensation gain values are between 1.5 and 15.

3. The equalizer adjustment method as claimed in claim 2, wherein when the target frequencies are between 250 Hz and 2000 Hz, the compensation gain values corresponding to the target frequencies are between 1.5 and 4.

4. The equalizer adjustment method as claimed in claim 3, wherein when the target frequencies are greater than 4000 Hz, the compensation gain values are between 1.7 and 12.

5. The equalizer adjustment method as claimed in claim 1, wherein the electronic device further comprises a display module and an input module, the step of obtaining the age data of the user through the equalizer adjustment module further comprising:
    the equalizer adjustment module providing an age input interface to the display module, and receiving the age data of the user from the input module.

6. The equalizer adjustment method as claimed in claim 1, wherein the electronic device further comprises a sound receiver module, the step of obtaining the age data of the user through the equalizer adjustment module further comprising:
    the equalizer adjustment module receiving a sound file of the user from the sound receiver module, and obtaining the age data according to the sound file.

7. An electronic device, comprising:
    an equalizer;
    a storage module, which stores a list of age gain values, the list of age gain values comprising a plurality of age segments between a first age segment and a Nth age segment, respectively increasing from the first age segment to the Nth age segment, each of the age segments comprising a group correction parameter, the group correction parameter comprising a plurality of compensation gain values respectively corresponding to a plurality of target frequency, and the compensation gain values in the same target frequency are increased as N increases; and
    an equalizer adjustment module, electrically connected to the storage module and the equalizer, the equalizer adjustment module comprising:
        an age data acquisition unit, which obtains an age data of a user;
        a parameter inquiry unit, which obtains a target age segment according to the age data, wherein the target age segment is one of the age segments, the parameter inquiry unit obtaining the group correction parameter corresponding to the target age segment; and
        a parameter setting unit, which is used to adjust a gain value setting of the equalizer to sound at different frequencies according to the group correction parameter.

8. The electronic device as claimed in claim 7, wherein the compensation gain values are between 1.5 and 15.

9. The electronic device as claimed in claim 8, wherein when the target frequencies are between 250 Hz and 2000 Hz, the compensation gain values corresponding to the target frequency are between 1.5 and 4.

10. The electronic device as claimed in claim 7, wherein when the target frequencies are greater than 4000 Hz, the compensation gain values are between 1.7 and 12.

11. The electronic device as claimed in claim 7, further comprising:
    a display module, which is electrically connected to the equalizer adjustment module, the age data acquisition unit provides an age input interface to the display module; and
    an input module, which is electrically connected to the equalizer adjustment module, the age data acquisition unit receives the age data of the user from the input module.

12. The electronic device as claimed in claim 7, further comprising:
    a sound receiver module, electrically connected to the equalizer adjustment module, wherein the age data acquisition unit receives a sound file of the user from the sound receiver module and obtains the age data according to the sound file.

13. The electronic device as claimed in claim 7, further comprising an audio processing module, and the equalizer being disposed in the audio processing module.

* * * * *